United States Patent
Utsumi et al.

(10) Patent No.: US 11,469,303 B2
(45) Date of Patent: Oct. 11, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Masaki Miyazato, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/107,605

(22) Filed: Nov. 30, 2020

(65) Prior Publication Data
US 2021/0217852 A1 Jul. 15, 2021

(30) Foreign Application Priority Data
Jan. 9, 2020 (JP) .............................. JP2020-002469

(51) Int. Cl.
| | |
|---|---|
| *H01L 21/268* | (2006.01) |
| *H01L 29/16* | (2006.01) |
| *H01L 29/45* | (2006.01) |
| *H01L 21/04* | (2006.01) |

(52) U.S. Cl.
CPC ...... *H01L 29/1608* (2013.01); *H01L 21/0485* (2013.01); *H01L 21/268* (2013.01)

(58) Field of Classification Search
CPC ..... H01L 21/04; H01L 21/0485; H01L 21/26; H01L 21/268; H01L 29/16; H01L 29/16008; H01L 29/1608; H01L 29/45
USPC ........................................................ 257/77
See application file for complete search history.

(56) References Cited

U.S. PATENT DOCUMENTS

| | | | |
|---|---|---|---|
| 2014/0061674 A1* | 3/2014 | Imai | .................... H01L 29/6606 257/77 |
| 2020/0152594 A1* | 5/2020 | Utsumi | ................... H01L 24/03 |

FOREIGN PATENT DOCUMENTS

| | | |
|---|---|---|
| JP | 5369762 B2 | 12/2013 |
| JP | 5460975 B2 | 4/2014 |

\* cited by examiner

*Primary Examiner* — Fazli Erdem
(74) *Attorney, Agent, or Firm* — Rabin & Berdo, P.C.

(57) ABSTRACT

A semiconductor device includes a semiconductor device provided on a semiconductor substrate and an ohmic electrode provided on a back surface of the semiconductor device and containing a nickel silicide and a molybdenum carbide, or the nickel silicide and a titanium carbide. The ohmic electrode is configured by first regions where a silicide is thick and second regions where the silicide is thin; a ratio of an arithmetic area of the second regions to an arithmetic area of the ohmic electrode is in a range from 10% to 30% in a plan view.

6 Claims, 13 Drawing Sheets

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2020-002469, filed on Jan. 9, 2020, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Single crystal silicon (Si) is used as a material of power semiconductor devices that control high voltage and/or large current. At present, there are several types of silicon power semiconductor devices and these devices are selectively used according to an intended purpose. For example, P-intrinsic-N diodes (PiN diodes), bipolar transistors, and insulated gate bipolar transistors (IGBTs) are so-called bipolar-type devices. These devices have high current density but cannot perform high-speed switching; the limit of switching frequency is about several kHz for bipolar transistors and about several tens of kHz for IGBTs. On the other hand, power metal oxide semiconductor field effect transistors (MOSFETs) cannot accommodate large current but can be used at high speeds up to several MHz. Nonetheless, there is strong demand in the market for power devices that combine large current and high speeds; silicon IGBTs, power MOSFETs and the like have been intensively developed and improved, and at present, have substantially reached the theoretical limit determined by the silicon material.

Materials have also been studied from the perspective of power semiconductor devices and silicon carbide (SiC) has particularly gained attention recently for next-generation power semiconductor devices because these are devices that excel regarding low ON voltage, high-speed characteristics, and high-temperature characteristics. This is because SiC is chemically a very stable material, has a wide bandgap of 3 eV, can be used very stably as a semiconductor even at high temperatures, and has a critical field strength that is at least ten times greater than that of silicon. SiC is likely to exceed the material limits of silicon and therefore, further growth is greatly expected for power semiconductor applications. In particular, for ultra-high voltage applications such as for pulsed power and electric power exceeding breakdown voltages of 10 kV, there are also high expectations for SiC application to PiN diodes, which are bipolar devices.

A power semiconductor module is a power semiconductor device that has one or more power semiconductor chips, configures a part of or all of a power conversion device, and has a structure in which the power semiconductor chip and a base board or a metal substrate are electrically insulated from one another. In industrial applications, power semiconductor modules are used in control inverters that drive motors such as in elevators. Furthermore, in recent years, use has become widespread in control inverters that drive vehicular motors. Long-term reliability under high-temperature operation is demanded of vehicular inverters due to their disposal near the drive motor in the engine room as a result of reductions in size and weight to improve vehicle fuel efficiency.

Thus, a smaller size and lighter weight are demanded of vehicle power semiconductor modules as compared to industrial power semiconductor module. Further, the output power density to drive a motor becomes high and therefore, semiconductor chip temperature during operation of the motor becomes high and demand for long-term reliability during high-temperature operation is increasing. Therefore, a power semiconductor module structure for high-temperature operation and having long-term reliability is demanded.

Thus, in a conventional silicon carbide semiconductor device, when a power semiconductor chip is mounted on a silicon carbide semiconductor substrate, an electrode for connecting the power semiconductor chip to an electronic circuit, etc., particularly when a back electrode such as a drain electrode, etc. is formed, an ohmic electrode is formed having reduced contact resistance between the silicon carbide semiconductor substrate and the back electrode.

As a method of forming the above ohmic electrode, a commonly known method includes forming a Ni silicide film on a silicon carbide semiconductor substrate by performing a silicide process including performing a heat treatment after vapor deposition of nickel (Ni) on the silicon carbide semiconductor substrate, to obtain an ohmic electrode having a low-resistance (small potential barrier) connection to both n-type SiC and p-type SiC in a semiconductor device configured by a silicon carbide semiconductor substrate.

For example, a metal thin film to form a silicide is formed on a back surface of a silicon carbide semiconductor substrate, a laser is irradiated, and a silicide layer is formed on the metal thin film, whereby a back electrode is formed (for example, refer to Japanese Patent No. 5460975). For the metal thin film, a metal containing any one or more of Ni, titanium (Ti), molybdenum (Mo), and tungsten (W) is used. To form the silicide layer, polishing is performed so that roughness (Ra) of the back surface of the semiconductor substrate is in a range from 10 nm to 500 nm, laser light having a wavelength of 355 nm is used, and the laser light is irradiated so that an arithmetic product of photon energy (eV) and laser output (mJ/cm$^2$) is in a range from 1000 (eV·mJ/cm$^2$) to 8000 (eV·mJ/cm$^2$).

Further, Mo, which is a metal that generates carbide, is added and Ni, which is a metal that generates silicide, is included, thereby forming a metal thin film that is a stacked film of Mo and Ni; the metal thin film and carbon in the silicon carbide are caused to react to form a carbide layer, whereby an ohmic electrode is formed; an unnecessary film formed by silicon particles or silicon oxide occurring on the surface of the carbide layer is removed and thus, the back electrode is formed (for example, refer to Japanese Patent No. 5369762). Here, by laser annealing, the metal thin film and carbon in the silicon carbide are caused to react with one another to form the carbide layer.

SUMMARY OF THE INVENTION

According to an embodiment of the invention, a silicon carbide semiconductor device includes a semiconductor substrate; a semiconductor device provided on the semiconductor substrate; and an ohmic electrode provided on a back surface of the semiconductor device, and having opposite first and second surfaces, the first surface facing the back surface of the semiconductor device, the ohmic electrode containing a nickel silicide and a molybdenum carbide, or a nickel silicide and a titanium carbide, the ohmic electrode being configured by a first region and a second region, where a silicide of the second region has a thickness that is less than a thickness of a silicide of the first region, a ratio of an arithmetic area of the second region to an arithmetic area of the ohmic electrode being in a range from 10% to 30% in a plan view of the semiconductor device.

In the embodiment, a roughness (Ra) of the back surface of the semiconductor device is in a range from 0.1 µm to 0.15 µm.

In the embodiment, the silicon carbide semiconductor device further includes a protective film provided on the second surface of the ohmic electrode, and containing titanium, titanium nitride, or tantalum.

According to another embodiment of the invention, a method of manufacturing a silicon carbide semiconductor device includes forming a semiconductor device on an upper surface of a semiconductor substrate; polishing a back surface of the semiconductor substrate that is opposite to the upper surface of the semiconductor substrate to have a roughness (Ra) of the back surface in a range from 2 nm to less than 10 nm; sequentially depositing on the back surface of the semiconductor substrate after polishing, molybdenum and nickel, or titanium and nickel; and forming an ohmic electrode from a nickel silicide and a titanium carbide, or a nickel silicide and a molybdenum carbide through a laser annealing treatment after sequentially depositing the molybdenum and the nickel, or the titanium and the nickel.

In the embodiment, the ohmic electrode is formed by irradiating laser light two or three times on a region in which the molybdenum and the nickel or the titanium and the nickel are sequentially deposited.

In the embodiment, the method further includes forming a protective film containing titanium, titanium nitride, or tantalum, on a first surface of the ohmic electrode, the first surface being opposite to a second surface of the ohmic electrode facing the semiconductor device.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
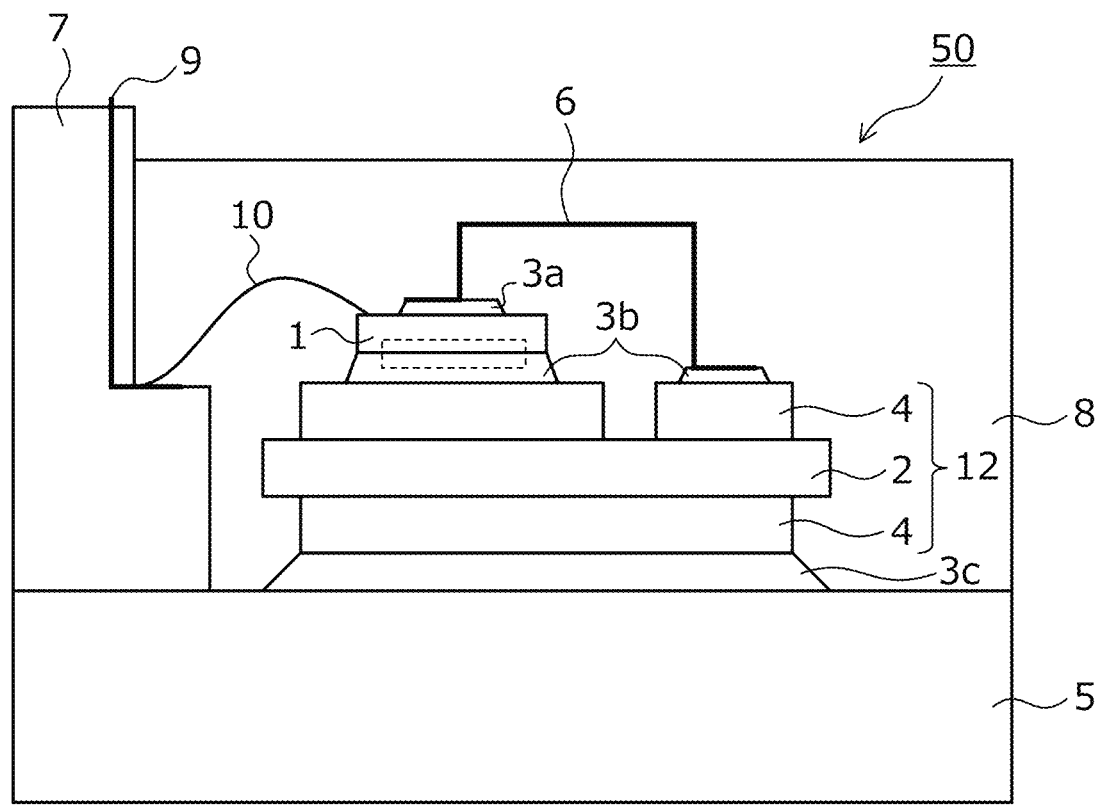
FIG. 1 is a cross-sectional view of a configuration of a power semiconductor module according to an embodiment.

First, problems associated with the conventional techniques are described. In Japanese Patent No. 5460975 and Japanese Patent No. 5369762, the silicide layer is depicted in the drawings as being formed uniformly on the back surface of the silicon carbide semiconductor substrate. However, in actuality, variations in the thickness of the silicide layer occur depending on the polished state of the back surface of the silicon carbide semiconductor substrate.

Further, in Japanese Patent No. 5460975 and Japanese Patent No. 5369762, conditions regarding variation of the thickness of the silicide layer and surface roughness of the back surface of the silicon carbide semiconductor substrate after silicide formation are not discussed. Furthermore, formation of an ohmic electrode improving adhesion of regions formed on the ohmic electrode is difficult with the convention techniques.

Embodiments of a silicon carbide semiconductor device and a method of manufacturing a silicon carbide semiconductor device according to the present invention are described in detail with reference to the accompanying drawings. In the description of the embodiments below and the accompanying drawings, main portions that are identical are given the same reference numerals and are not repeatedly described. Further, in the present description, when Miller indices are described, "-" means a bar added to an index immediately after the "-", and a negative index is expressed by prefixing "-" to the index.

FIG. 1 is a cross-sectional view of a configuration of a power semiconductor module according to an embodiment. As depicted in FIG. 1, a power semiconductor module 50 includes a power semiconductor chip 1, an insulated substrate 2, bonding materials 3a, 3b, 3c, an electrode pattern 4, a metal substrate 5, lead frame wiring 6, a resin case 7, a sealing resin 8, a metal terminal 9, and a metal wire 10.

The power semiconductor chip 1 is a semiconductor device such as a metal oxide semiconductor field effect transistor (MOSFET), an insulated gate bipolar transistor (IGBT), or a diode chip. Without particular limitation to these semiconductor devices, the power semiconductor chip 1 may be another semiconductor device. On a front surface (surface facing the power semiconductor chip 1) and a back surface (surface facing the metal substrate 5) of the insulated substrate 2 that is, for example, a ceramic substrate that ensures insulation, the electrode pattern 4 formed by, for example, a copper (Cu) plate is provided. Herein, a substrate in which the electrode pattern 4 is provided on at least one surface of the insulated substrate 2 is a stacked substrate 12. On the electrode pattern 4 of the front surface, the power semiconductor chip 1 is bonded by the bonding material 3b such as a solder. On the electrode pattern 4 of the back surface, the metal substrate 5 provided with a heat dissipation fin (not depicted) is bonded by the bonding material 3c such as a solder. Further, as wiring for an electrical connection, a first end of the lead frame wiring 6 is bonded to a top surface (surface opposite the surface in contact with the bonding material 3b) of the power semiconductor chip 1 by the bonding material 3a such as a solder. A second end of the lead frame wiring 6 is bonded to the electrode pattern 4 by the bonding material 3b.

The resin case 7 is combined with the power semiconductor chip 1, the stacked substrate 12, and the metal substrate 5 stacked in a stacked assembly. For example, the resin case 7 is adhered to the stacked assembly by an adhesive such as a silicone-based adhesive. Further, to insulate and protect the power semiconductor chip 1 on the stacked substrate 12, the resin case 7 is filled with the sealing resin 8 such as a hard resin like an epoxy resin. In a first embodiment, a hard resin such as an epoxy resin is used as the sealing resin 8, and no cover is used. Further, the metal wire 10 is connected between the power semiconductor chip 1 and the metal terminal 9. The metal terminal 9 penetrates through the resin case 7 to protrude externally.

Figure 2:
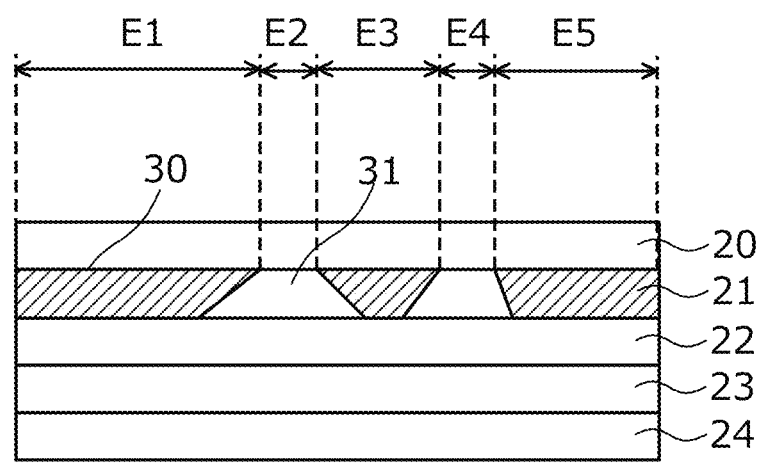
FIG. 2 is a cross-sectional view of a configuration of a rear electrode region of the power semiconductor module according to the embodiment.

FIG. 2 is a cross-sectional view of a configuration of a rear electrode region of the power semiconductor module according to the embodiment. FIG. 2 is an enlarged view of a portion surrounded by a dotted line in FIG. 1. As depicted in FIG. 2, on a back surface of a silicon carbide semiconductor device 20 (corresponds to the power semiconductor chip 1 in FIG. 1) of the semiconductor substrate, an ohmic electrode 21 in ohmic contact with the semiconductor substrate is provided. The ohmic electrode 21 is a composite film containing a nickel silicide and a molybdenum carbide, or a nickel silicide and a titanium carbide. The composite film of a nickel silicide and a molybdenum carbide is a MoNi silicide layer formed by laser annealing after Mo, Ni are sequentially deposited on the silicon carbide semiconductor device 20. The composite film of a nickel silicide and a titanium carbide is a TiNi silicide layer formed by laser annealing after Ti, Ni are sequentially deposited on the silicon carbide semiconductor device 20.

On a back surface of the ohmic electrode 21, a Ti film 22 that functions as a protective film is provided. The Ti film 22 may be a titanium nitride (TiN) film, or a Ta (tantalum) film. On a back surface of the Ti film 22, nickel for improving adhesion with the Ti film 22, and a Ni/Au film 23 in which a metal for preventing oxidation is deposited are provided. On a back surface of the Ni/Au film 23, a solder 24 (corresponds to the bonding material 3b in FIG. 1) for bonding the lead frame wiring 6 is provided. Further, for the solder 24, for example, a low-temperature solder containing tin (Sn) may be used.

Herein, roughness (Ra) of the back surface of the silicon carbide semiconductor substrate is in a range from 0.1 μm to 0.15 μm. Herein, the roughness (Ra) is arithmetic average roughness (Ra) of the back surface. Further, as described hereinafter, during manufacture of the power semiconductor module, the roughness (Ra) of the back surface of the silicon carbide semiconductor substrate is polished to be in a range from 2 nm to less than 10 nm. This roughness increases due to laser annealing when the ohmic electrode 21 are formed and therefore, the roughness (Ra) of the back surface of the silicon carbide semiconductor substrate after manufacture is as indicated below.

Figure 3A:
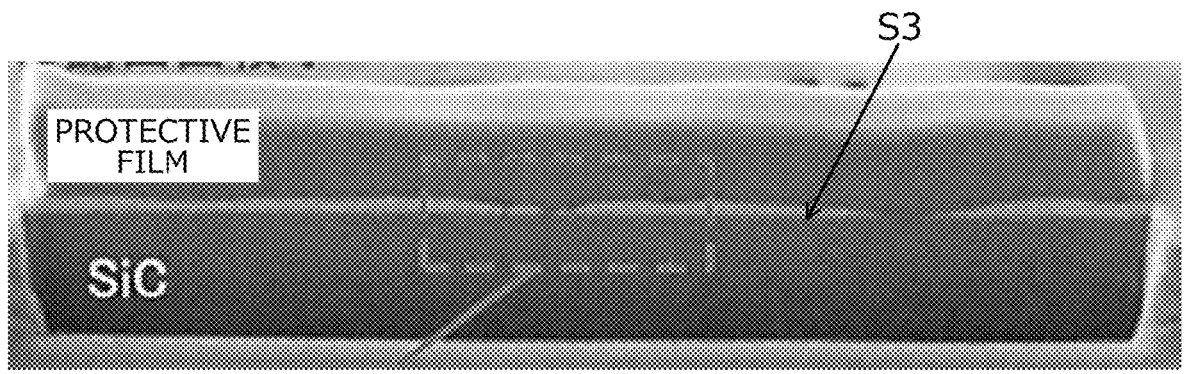
FIG. 3A is a figure showing an overall image of a cross-section of a MoNi silicide layer.
Figure 3B:
FIG. 3B is a figure showing an overall image of a cross-section of the MoNi silicide layer.
Figure 4A:
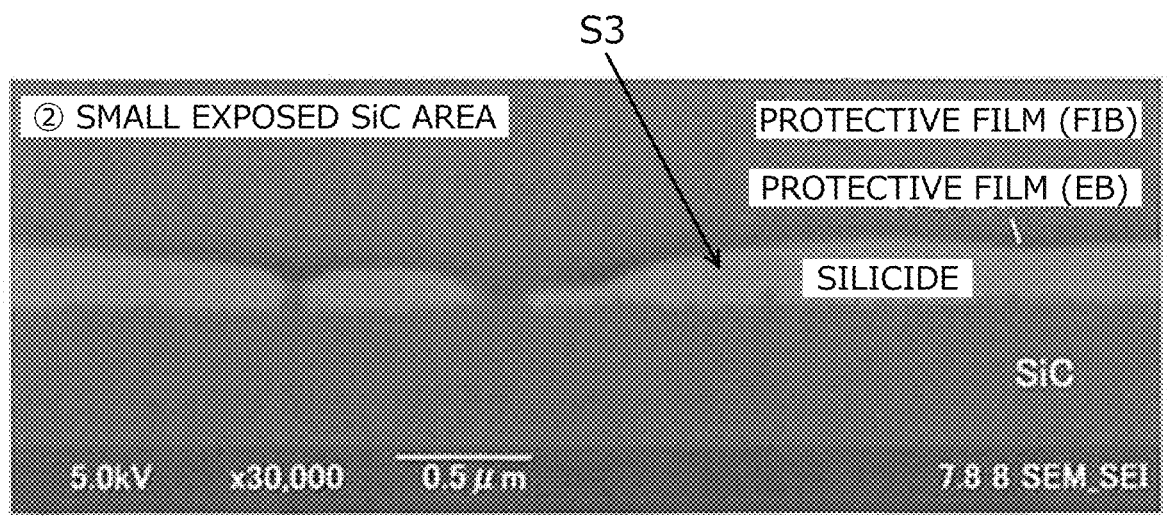
FIG. 4A is a figure showing an enlarged image of a portion of the MoNi silicide layer surrounded by a dotted line in FIG. 3A.
Figure 4B:
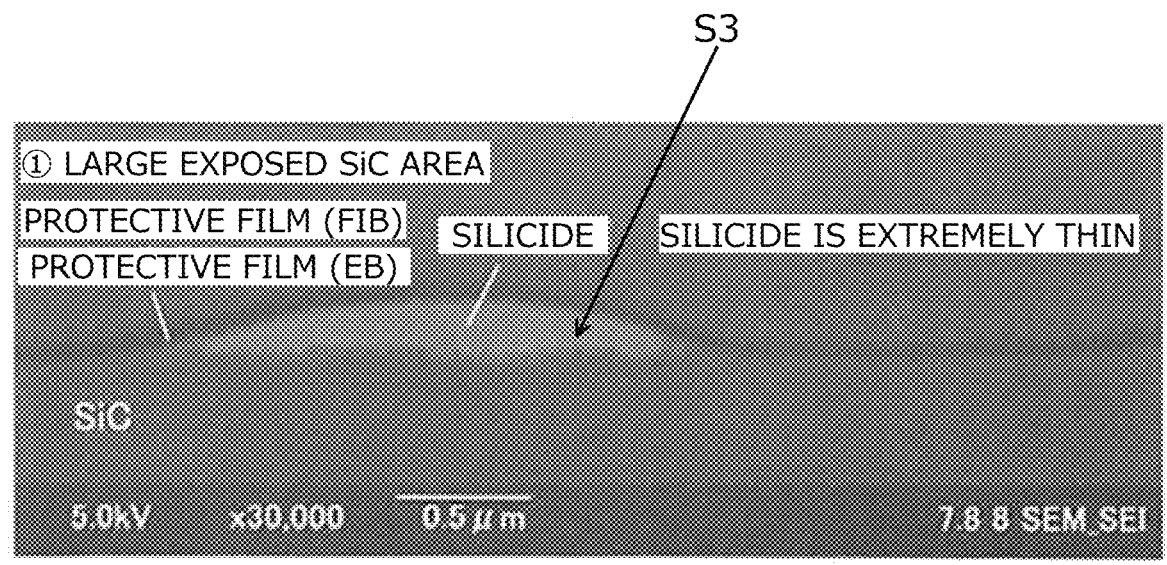
FIG. 4B is a figure depicting an enlarged image of a portion of the MoNi silicide layer surrounded by a dotted line in FIG. 3B.
Figure 5A:
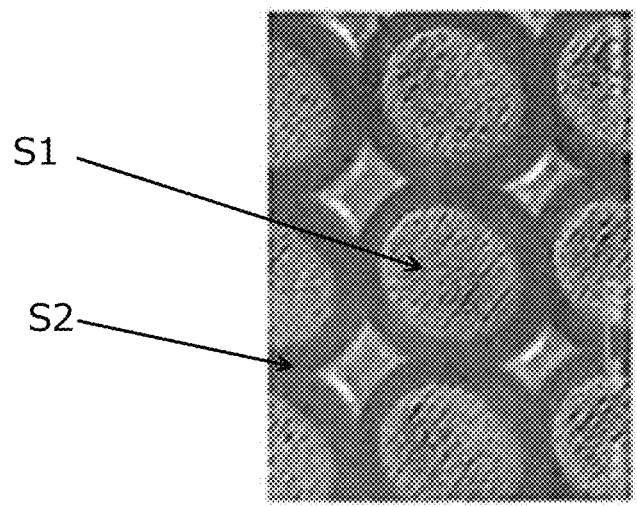
FIG. 5A is a figure showing a surface image of the MoNi silicide layer for laser overlap of 0/0.
Figure 5B:
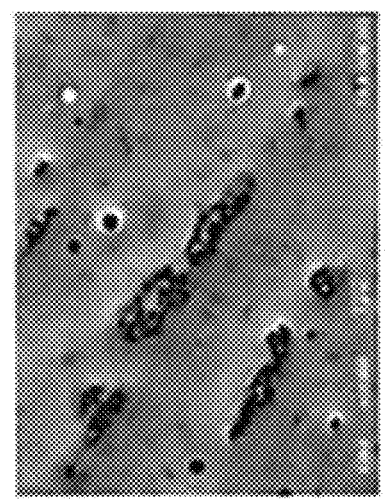
FIG. 5B is a figure showing an enlarged view of the surface of the MoNi silicide layer for the laser overlap of 0/0.

Further, variation of the thickness of the silicide layer occurs depending on the polished state of the back surface of the silicon carbide semiconductor substrate. FIGS. 3A and 3B are figures showing overall images of a cross-section of a MoNi silicide layer. FIG. 4A is a figure showing an enlarged image of a portion of the MoNi silicide layer surrounded by a dotted line in FIG. 3A; and FIG. 4B is a figure depicting an enlarged image of a portion of the MoNi silicide layer surrounded by a dotted line in FIG. 3B. FIGS. 3A and 3B are images at a magnification of 5000 times obtained by a scanning electron microscope (SEM); FIGS. 5A and 5B are images at a magnification of 30000 times. In FIG. 3A to FIG. 4B, the images of the cross-sections are taken after a protective film is formed on the MoNi silicide layer 21 by laser overlapping 67/50 described hereinafter.

FIGS. 3A and 3B are different cross-sections of the same semiconductor chip; FIG. 3A is a cross-section of an area having many regions where the silicide is thick; and FIG. 3B is a cross-section of an area have few regions where the silicide is thick. In FIGS. 3A to 4B, white portions S3 are regions where the silicide is thick.

As depicted in FIGS. 3A to 4B, the ohmic electrode 21 is configured by a first region where the silicide is thick and a second region where the silicide is thin. When the second region is checked using a transmission electron microscope (TEM), in the second region as well, a layer in ohmic contact is formed, however, about half of this layer is a precipitated carbon (C) layer. Therefore, the second region has poor adhesion with the Ti film 22.

FIG. 2 depicts the ohmic electrode 21 schematically, and the ohmic electrode 21 is configured by first regions 30 where the silicide is thick (hatched regions in FIG. 2) and second regions 31 where the silicide is thin, the second regions 31 containing precipitated carbon.

Next, to investigate a relationship between a ratio of the second regions 31 and adhesion with the Ti film 22, the ohmic electrode 21 was assumed to be a MoNi silicide layer, laser annealing conditions were varied, and the adhesion between the ohmic electrode 21 and the Ti film 22 was tested. In the laser annealing, an entire area of the surface of the silicon carbide semiconductor substrate cannot be irradiated by laser light in a single session and therefore, single irradiations of laser light were performed slightly shifted from one another. For example, after one irradiation of laser light, the position of the laser is shifted in an x direction and a subsequent irradiation is performed. When the position of the laser reaches an outermost periphery of the silicon carbide semiconductor substrate, the position of the laser is shifted in a y direction and the subsequent irradiation is performed. In this manner, scanning laser light irradiation is performed on the silicon carbide semiconductor substrate. Further, for the laser light, a solid state laser such as Yttrium Aluminum Garnet (YAG) laser is used.

Here, in an instance in which the subsequent irradiation is performed shifted in the x direction and the y direction, single irradiations of the laser light may be overlapped. Irradiation overlap between one irradiation of the laser light and the subsequent irradiation of the laser light in the x direction is A % and irradiation overlap in the y direction is B %, whereby laser overlap is indicated as A/B. Further, a single irradiation of the laser light is a region up to where the intensity of the laser light becomes half (half width). Further, in an instance of, for example, a <11-20> direction and the silicon carbide semiconductor device having a stripe-pattern trench structure, the x direction is the direction of the stripes. The y direction is a direction orthogonal to the x direction, on the back surface of the silicon carbide semiconductor substrate.

For example, laser overlap of 0/0 indicates that irradiation overlap between one irradiation of the laser light and the subsequent irradiation of the laser light in the x direction is 0% and the irradiation overlap in the y direction is 0%. Similarly, laser overlap of 67/50 indicates that irradiation overlap between one irradiation of the laser light and the subsequent irradiation of the laser light in the x direction is 67% and the irradiation overlap in the y direction is 50%.

Hereinafter, the test results of the adhesion between the ohmic electrode 21 and the Ti film 22 in instances of laser overlap of 0/0, 33/33, 67/50, 67/67, and 80/80 as laser annealing conditions are shown.

Figure 5C:
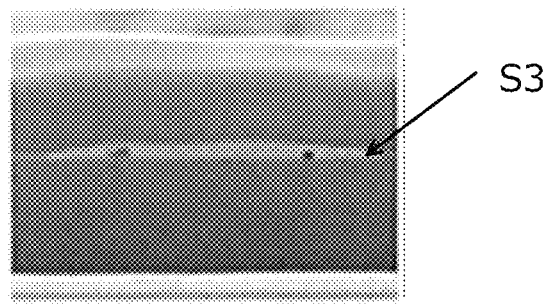
FIG. 5C is a figure showing an image of a cross-section of the MoNi silicide layer for the laser overlap of 0/0.

FIG. 5A is a figure showing a surface image of the MoNi silicide layer for laser overlap of 0/0. FIG. 5B is a figure showing an enlarged view of the surface of the MoNi silicide layer for the laser overlap of 0/0. FIG. 5C is a figure showing an image of a cross-section of the MoNi silicide layer for the laser overlap of 0/0. FIGS. 5A, 5B, and 5C are images from a scanning electron microscope after formation of the MoNi silicide layer 21. FIG. 5A is an image at a magnification of 500 times; FIG. 5B is an image at a magnification of 5000 times; and FIG. 5C is an image at a magnification of 20000 times. In FIG. 5C, the image of the cross-section is taken after the formation of a protective film on the MoNi silicide layer 21.

One irradiation of the laser light is circular and therefore, with the laser overlap of 0/0, when the irradiation overlap in the x direction and the y direction is 0%, irradiation of the laser light at the back surface of the silicon carbide semiconductor substrate is insufficient in some portions. For example, circular white portions S1 in FIG. 5A are the first regions 30 irradiated with the laser light and where the silicide is thick; black portions S2 are regions where irradiation of the laser light is insufficient and as a result, the heat is does not increase sufficiently and silicide is not formed. Further, in the cross-section depicted in FIG. 5C, the white portions S3 at a center are the first regions 30 where the silicide is thick.

With the laser overlap of 0/0, a region that is not irradiated with laser, or where silicide is not formed due to insufficient heating by laser irradiation occurs. Therefore, the ratio of the second regions 31 where silicide containing precipitated carbon is thin was low and an area ratio of the second regions 31 was about 6%. The area ratio of the second regions 31 is a ratio of the arithmetic area of the regions where the silicide containing precipitated carbon is thin to the arithmetic area of the regions where the silicide is thick. For example, in FIG. 2, E2 and E4 are arithmetic areas of the second regions 31, which are areas that are direct contact with the silicon carbide semiconductor device 20. E1, E3 and E5 are arithmetic areas of the first regions 30, which are areas that are also direct contact with the silicon carbide semiconductor device 20. The area ratio of a total arithmetic area of the second regions 31 to an arithmetic area of the ohmic electrode is E2+E4/(E1+E2+E3+E4+E5). For this area ratio, with respect to an enlarged image of the surface of the MoNi silicide layer, for example, the brightness of the image is set to 256 gradations, black points are detected with a brightness of 75 set as a threshold, and the area ratio thereof is calculated. In this manner, measurement is possible by setting a threshold for image brightness and performing binarization.

In this instance, with the laser overlap of 0/0, the adhesion between the ohmic electrode 21 and the Ti film 22 was favorable. However, in the second regions 31 where the silicide is thin, carbon precipitates and therefore, resistance decreases. With the laser overlap of 0/0, other than the second regions 31 where the silicide is thin, portions not irradiated with laser or not heated sufficiently occur, whereby silicide conversion does not occur and no ohmic contact is formed occur and therefore, resistance of the ohmic electrode 21 and resistance of the Ti film 22 increased.

Figure 6A:
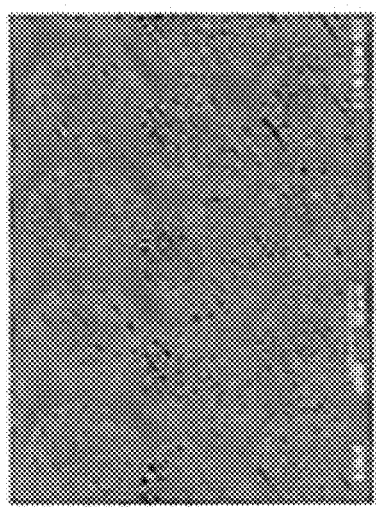
FIG. 6A is a figure showing a surface image of the MoNi silicide layer for laser overlap of 33/33.
Figure 6B:
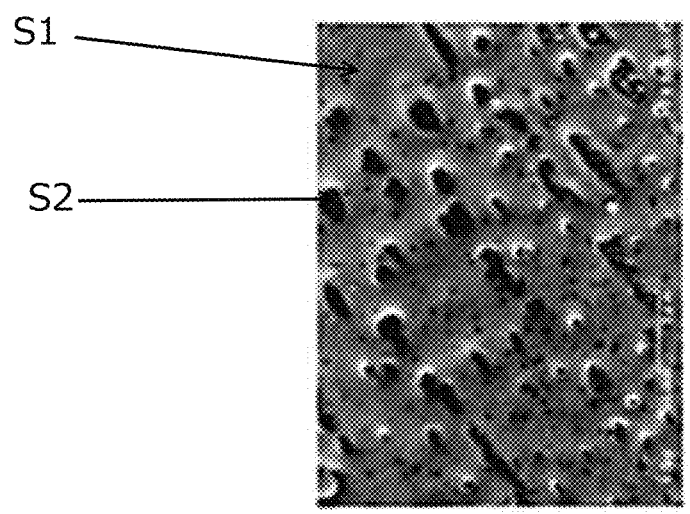
FIG. 6B is a figure showing an enlarged view of a surface of the MoNi silicide layer for the laser overlap of 33/33.
Figure 6C:
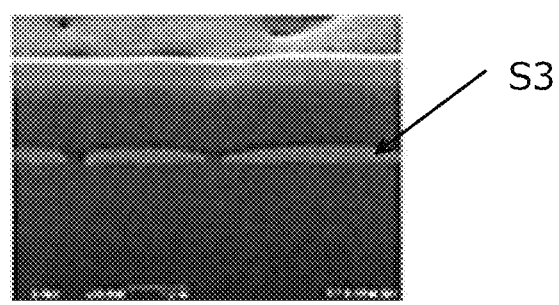
FIG. 6C is a figure showing an image of a cross-section of the MoNi silicide layer for the laser overlap of 33/33.

FIG. 6A is a figure showing a surface image of the MoNi silicide layer for laser overlap of 33/33. FIG. 6B is a figure showing an enlarged view of the surface of the MoNi silicide layer for the laser overlap of 33/33. FIG. 6C is a figure showing an image of a cross-section of the MoNi silicide layer for the laser overlap of 33/33. Imaging conditions for FIGS. 6A to 6C are similar to those for FIGS. 5A to 5C.

With the laser overlap of 33/33, laser light for which the irradiation overlap is 33% for scanning in the x direction and laser light for which the irradiation overlap is 33% for scanning in the y direction are irradiated on the back surface of the silicon carbide semiconductor substrate. Therefore, a center portion having a circular shape, where the laser light is irradiated is for one irradiation of the laser light. In FIG. 6A, while borders between the first regions 30 where the silicide is thick and the second regions 31 where the silicide is thin are not clear, in the enlarged view depicted in FIG. 6B, the white portions S1 that are the first regions 30 where the silicide is thick and the black portions S2 that are the second regions 31 where the silicide is thin are observed. Further, in the cross-section depicted in FIG. 6C as well, the white portions S3 at a center are observed, the white portions S3 being the first regions 30 where the silicide is thick.

In this manner, with laser overlap of 33/33, the ratio of the second regions 31 where the silicide is thin increased more than with the laser overlap of 0/0 and was about 10%. In this instance, the adhesion between the ohmic electrode 21 and the Ti film 22 was favorable and the resistance of the ohmic electrode 21 and the Ti film 22 was also favorable.

Figure 7A:
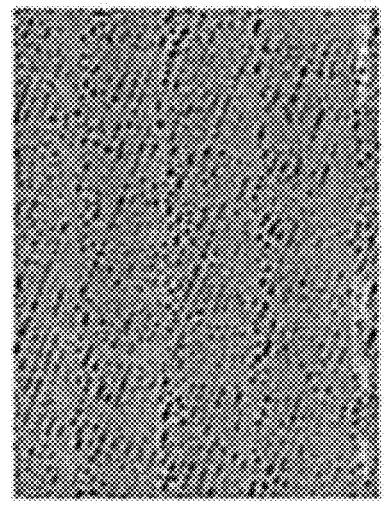
FIG. 7A is a figure showing a surface image of the MoNi silicide layer for laser overlap of 67/50.
Figure 7B:
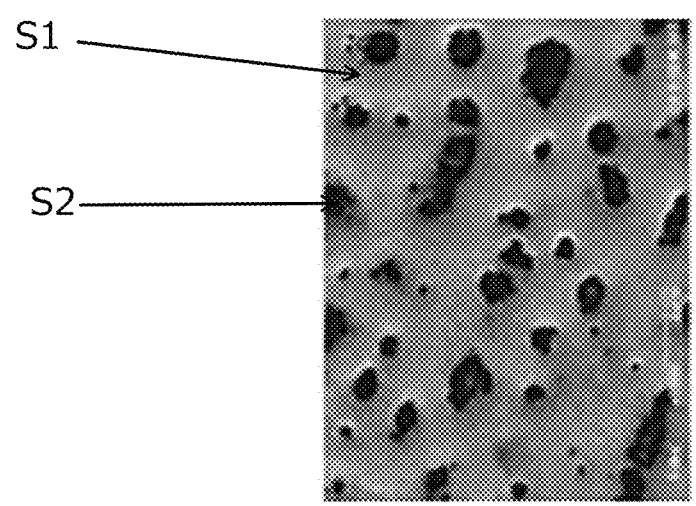
FIG. 7B is a figure showing an enlarged view of a surface of the MoNi silicide layer for the laser overlap of 67/50.
Figure 7C:
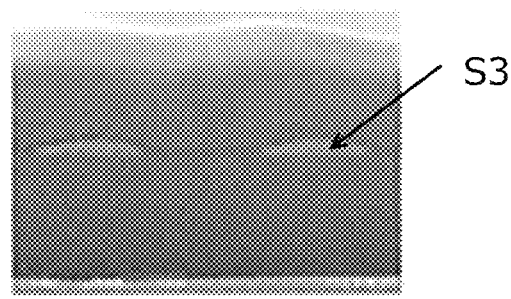
FIG. 7C is a figure showing an image of a cross-section of the MoNi silicide layer for the laser overlap of 67/50.

FIG. 7A is a figure showing a surface image of the MoNi silicide layer for laser overlap of 67/50. FIG. 7B is a figure showing an enlarged view of the surface of the MoNi silicide layer for the laser overlap of 67/50. FIG. 7C is a figure showing an image of a cross-section of the MoNi silicide layer for the laser overlap of 67/50. Imaging conditions for FIGS. 7A to 7C are similar to those for FIGS. 5A to 5C.

With the laser overlap of 67/50, laser light for which the irradiation overlap is 67% for scanning in the x direction and laser light for which the irradiation overlap is 50% for scanning in the y direction are irradiated on the back surface of the silicon carbide semiconductor substrate. Therefore, at least three times in the x direction, the laser light is irradiated. Therefore, similarly to the instance depicted in FIGS. 6A to 6C, in FIG. 7A, while borders between the first regions 30 where the silicide is thick and the second regions 31 where the silicide is thin are not clear, in the enlarged view depicted in FIG. 7B, the white portions S1 that are the first regions 30 where the silicide is thick and the black portions S2 that are the second regions 31 where the silicide is thin are observed. Further, in the cross-section depicted in FIG. 7C as well, the white portions S3 at a center are observed, the white portions S3 being the first regions 30 where the silicide is thick.

In this manner, with laser overlap of 67/50, the ratio of the second regions 31 where the silicide is thin is increased more than with the laser overlap of 33/33 and was about 14%. In this instance, the adhesion between the ohmic electrode 21 and the Ti film 22 was favorable and the resistance of the ohmic electrode 21 and the Ti film 22 was also favorable.

Figure 8A:
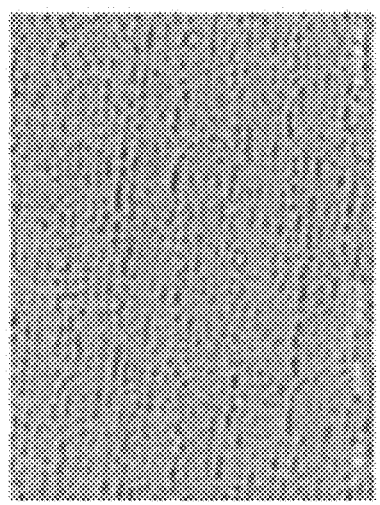
FIG. 8A is a figure showing a surface image of the MoNi silicide layer for laser overlap of 67/67.
Figure 8B:
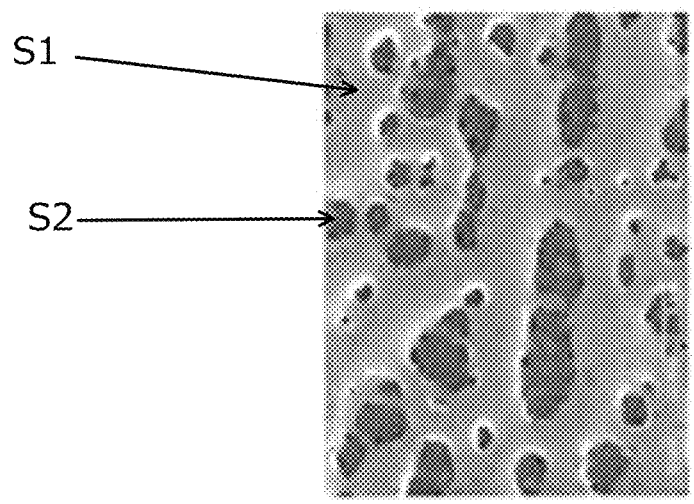
FIG. 8B is a figure showing an enlarged view of a surface of the MoNi silicide layer for the laser overlap of 67/67.
Figure 8C:
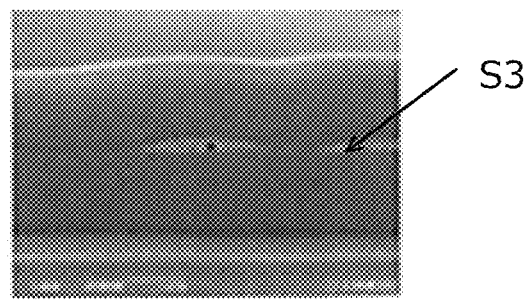
FIG. 8C is a figure showing an image of a cross-section of the MoNi silicide layer for the laser overlap of 67/67.

FIG. 8A is a figure showing a surface image of the MoNi silicide layer for laser overlap of 67/67. FIG. 8B is a figure showing an enlarged view of the surface of the MoNi silicide layer for the laser overlap of 67/67. FIG. 8C is a figure showing an image of a cross-section of the MoNi silicide layer for the laser overlap of 67/67. Imaging conditions for FIGS. 8A to 8C are similar to those for FIGS. 5A to 5C.

With the laser overlap of 67/67, laser light for which the irradiation overlap is 67% for scanning in the x direction and laser light for which the irradiation overlap is 67% for scanning in the y direction are irradiated on the back surface of the silicon carbide semiconductor substrate. Therefore, at least three times in the x direction and three to six times in the y direction, the laser light is irradiated. Therefore, images similar to an instance of those depicted in FIGS. 6A to 6C are obtained.

In this manner, with the laser overlap of 67/67, the ratio of the second regions 31 where the silicide is thin is increased more than with the laser overlap of 67/50 and was about 25%. In this instance, the adhesion between the ohmic electrode 21 and the Ti film 22 was favorable and the resistance of the ohmic electrode 21 and the Ti film 22 was also favorable.

Figure 9A:
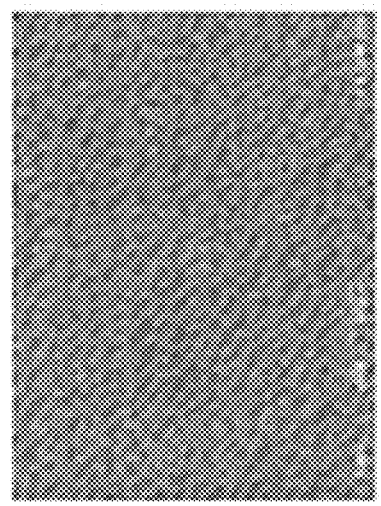
FIG. 9A is a figure showing a surface image of the MoNi silicide layer for laser overlap of 80/80.
Figure 9B:
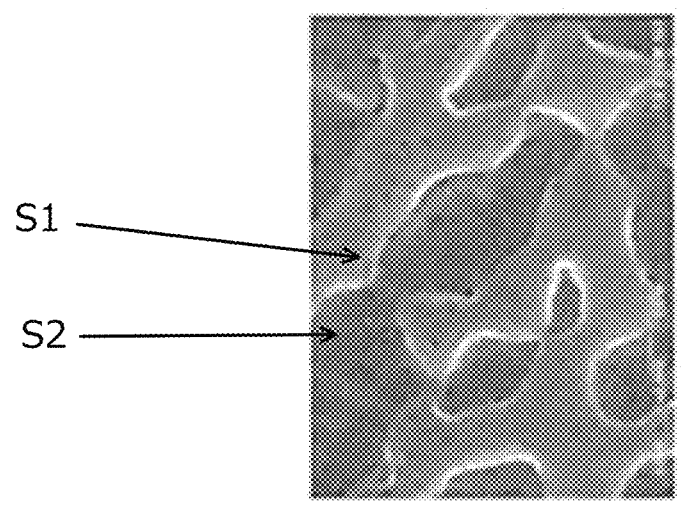
FIG. 9B is a figure showing an enlarged view of a surface of the MoNi silicide layer for the laser overlap of 80/80.
Figure 9C:
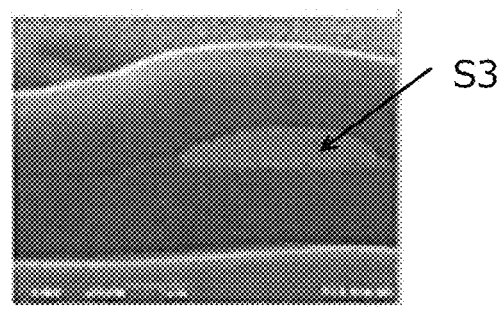
FIG. 9C is a figure showing an image of a cross-section of the MoNi silicide layer for the laser overlap of 80/80.

FIG. 9A is a figure showing a surface image of the MoNi silicide layer for laser overlap of 80/80. FIG. 9B is a figure showing an enlarged view of the surface of the MoNi silicide layer for the laser overlap of 80/80. FIG. 9C is a figure showing an image of a cross-section of the MoNi silicide layer for the laser overlap of 80/80. Imaging conditions for FIGS. 9A to 9C are similar to those for FIGS. 5A to 5C.

With the laser overlap of 80/80, laser light for which the irradiation overlap is 80% for scanning in the x direction and laser light for which the irradiation overlap is 80% for scanning in the y direction are irradiated on the back surface of the silicon carbide semiconductor substrate. Therefore, at least four times in the x direction, the laser light is irradiated. Therefore, in FIG. 9A, while borders between the first regions 30 where the silicide is thick and the second regions 31 where the silicide is thin are not clear, in the enlarged view depicted in FIG. 9B, the ratio of the black portions S2 that are the second regions 31 where the silicide is thin is greater than in the instances depicted in FIGS. 6B to 8B.

This was due to the laser irradiation being performed excessively. Further, in comparing FIGS. 9B and 8B, in FIG. 9B, the second regions 31 where the silicide is thin are larger.

In this manner, with the laser overlap of 80/80, the ratio of the second regions 31 where the silicide is thin is increased more than with the laser overlap of 67/67 and was about 34%. In this instance, the ratio of the second regions 31 was too high and the second regions 31 were too large, whereby the adhesion between the ohmic electrode 21 and the Ti film 22 was poor. Further, the resistance of the ohmic electrode 21 and the Ti film 22 was not favorable. It is conceivable that the adhesion between the second regions 31 and the Ti film 22 was insufficient and voids were formed, whereby the resistance increased.

Further, while not depicted, for the laser overlap of 67/80, the ratio of the second regions 31 where the silicide is thin is between that for the laser overlap of 67/67 and that for the laser overlap of 80/80, and was about 30%. In this instance, the adhesion between the ohmic electrode 21 and the Ti film 22 was favorable and the resistance of the ohmic electrode 21 and the Ti film 22 was favorable.

Further, while FIGS. 5A to 9C described above are results for the MoNi silicide layer, results for the TiNi silicide layer are similar.

Figure 10:
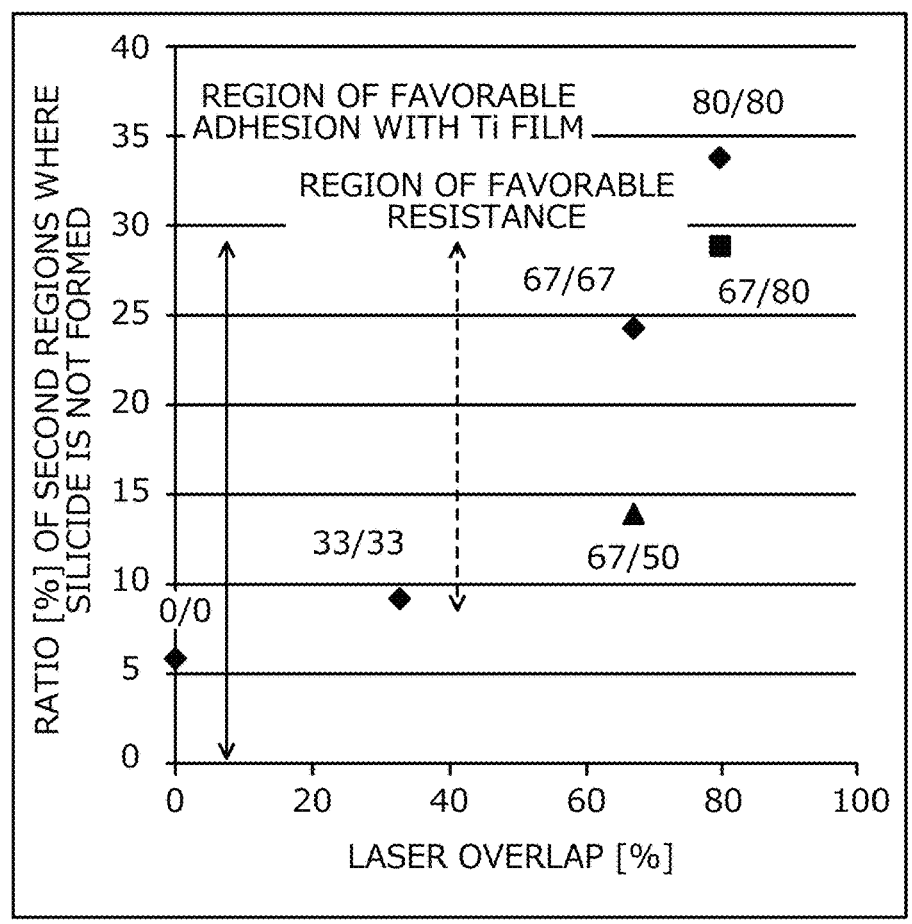
FIG. 10 is a graph depicting a relationship between laser overlap and the ratio of the second regions where the silicide is thin.

FIG. 10 is a graph depicting a relationship between laser overlap and the ratio of the second regions where the silicide is thin. In FIG. 10, a horizontal axis indicates the laser overlap in the x direction in units of percentage (%). A vertical axis represents the ratio of the second regions 31 where the silicide is thin in units of percentage (%). While FIG. 10 is a graph of the results of FIGS. 5A to 9C, a result for laser overlap of 67/80 not in FIGS. 5A to 9C is additionally included.

In the second regions 31 where the silicide is thin, adhesion with the Ti film 22 is poor and therefore, when the area ratio of the second regions 31 where the silicide is thin is high, the adhesion between the ohmic electrode 21 and the Ti film 22 decreases. In particular, from the results for the laser overlap of 67/67 and the laser overlap of 80/80, when the area ratio of the second regions 31 where the silicide is thin exceeds 30%, the adhesion between the ohmic electrode 21 and the Ti film 22 becomes poor. Therefore, the area ratio of the second region may be in a range from 0% to 30%. Further, in the second regions 31 where the silicide is thin, carbon precipitates and therefore, the resistance decreases. When the second regions 31 where the silicide is thin are too small, the resistance increases and therefore, the area ratio of the second region may be at least 10%.

Therefore, in the embodiment, the ratio of arithmetic area of the second regions 31 to the arithmetic area of the ohmic electrode 21 is set in a range from 10% to 30%. As a result, the adhesion between the ohmic electrode 21 and the Ti film 22 improves and the resistance of the ohmic electrode 21 and the Ti film 22 improves.

Figure 11:
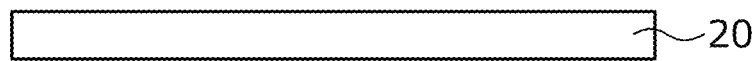
FIG. 11 is a cross-sectional view of a state of a back electrode of the power semiconductor module according to the embodiment during manufacture.
Figure 12:
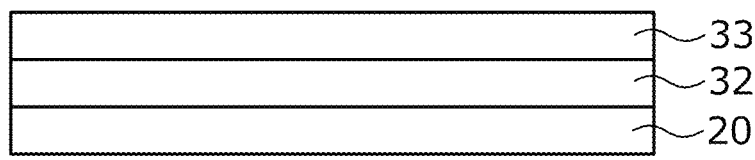
FIG. 12 is a cross-sectional view of a state of the back electrode of the power semiconductor module according to the embodiment during manufacture.
Figure 13:
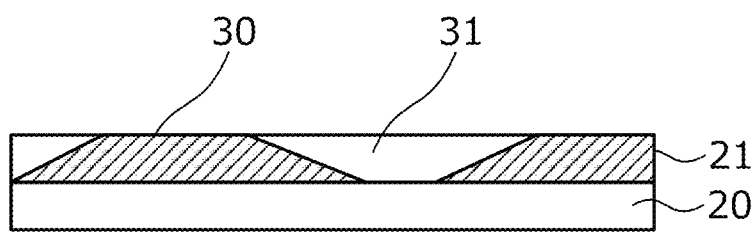
FIG. 13 is a cross-sectional view of a state of the back electrode of the power semiconductor module according to the embodiment during manufacture.

A method of manufacturing the silicon carbide semiconductor device according to the embodiment is described. FIGS. 11, 12, and 13 are cross-sectional views of states of a back electrode of the power semiconductor module according to the embodiment during manufacture. First, similarly to a method of manufacturing a silicon carbide semiconductor device by a conventional technique, the silicon carbide semiconductor device 20 is formed on the silicon carbide semiconductor substrate. For example, in an instance in which the silicon carbide semiconductor device is a MOSFET, a drift layer is formed on the silicon carbide semiconductor substrate by epitaxial growth and an impurity is implanted by ion implantation, whereby the base regions, the source regions, etc. are formed at the front surface. Next, the gate insulating films are selectively formed on the front surface by thermal oxidation, etc., and the MOS gate structures are formed. Next, the front electrode is formed. The state up to here is depicted in FIG. 11. In FIG. 11, the device structure and front electrode of the silicon carbide semiconductor device 20 are not depicted.

Next, the back surface of the silicon carbide semiconductor device 20 is polished so that the roughness (Ra) of the back surface is in a range from 2 nm to less than 10 nm. With only rough polishing using relatively coarse abrasive grains, the roughness (Ra) of the back surface is at least 10 nm and therefore, after the rough polishing, a finish-polishing using an abrasive grain (#10000) five times finer than the abrasive grain (#2000) used in the rough polishing is performed, whereby the roughness (Ra) of the back surface may set to be in a range from 2 nm to less than 10 nm. By setting this roughness (Ra), a damage layer is formed at the back surface of the silicon carbide semiconductor device 20, whereby the formation of a silicide by laser annealing is facilitated. Further, when dry polishing is performed, the roughness (Ra) is in a range from 0.5 nm to 2 nm, no damage layer is formed at the back surface, and the formation of a silicide by laser annealing is difficult and therefore, dry etching is not desirable.

Next, on the back surface of the silicon carbide semiconductor device 20, a Mo film 32 is deposited. The Mo film 32, for example, may be formed by performing sputtering vapor deposition. Next, on the Mo film 32, an Ni film 33 is deposited. The Ni film 33, for example, may be formed by performing sputtering vapor deposition. The state up to here is depicted in FIG. 12. In an instance of the TiNi silicide layer, deposition of a Ti film and an Ni film by a similar method is performed.

Figure 14A:
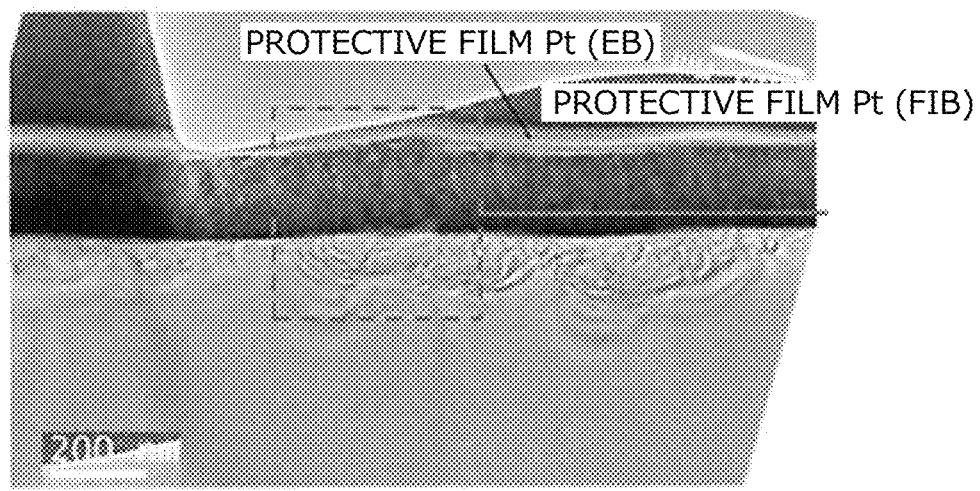
FIG. 14A is a figure showing an image of a cross-section of a Ni film and a Mo film before laser irradiation.
Figure 14B:
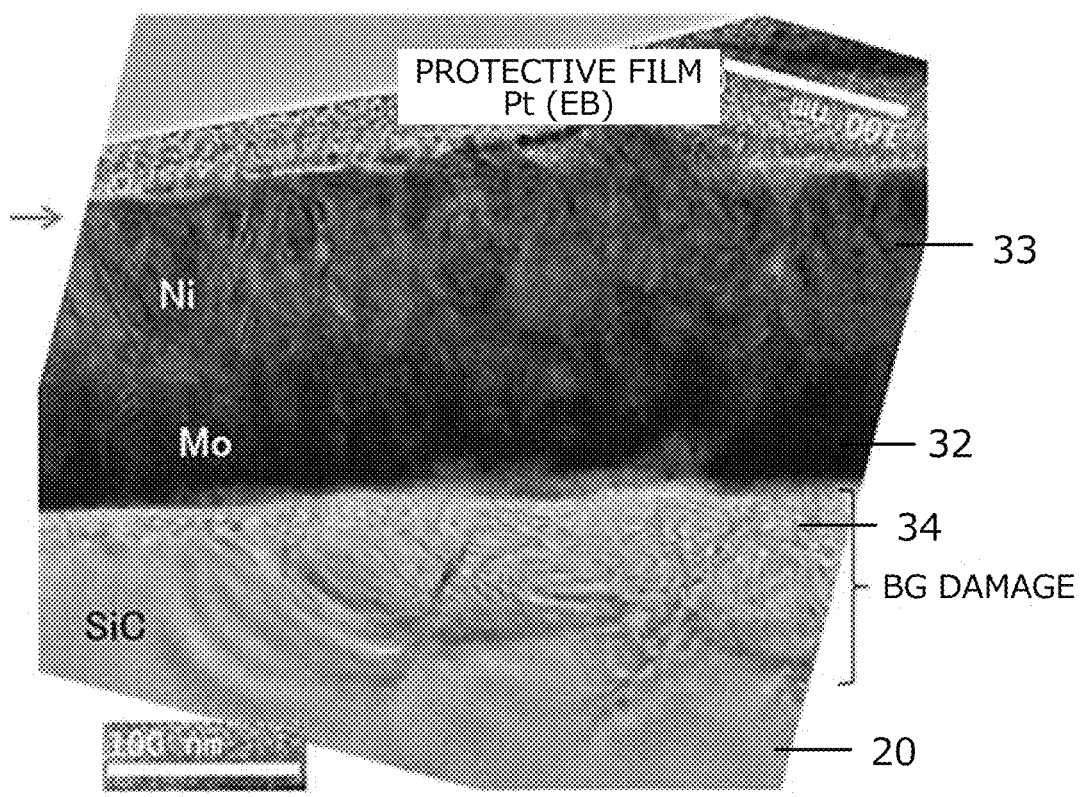
FIG. 14B is a figure showing an image of a cross-section of a portion of the Ni film and the Mo film surrounded by a dotted line in FIG. 14A before laser irradiation.

Herein, FIG. 14A is a figure showing an image of a cross-section of the Ni film and the Mo film before laser irradiation. FIG. 14B is a figure showing an image of a cross-section of a portion of the Ni film and the Mo film surrounded by a dotted line in FIG. 14A before laser irradiation. FIGS. 14A and 14B are SEM images of cross-sections after deposition of the Mo film 32 and the Ni film 33 on the back surface of the silicon carbide semiconductor device 20 having back surface roughness (Ra) in a range from 2 nm to less than 10 nm. As depicted in FIG. 14B, a damage layer 34 is formed between the back surface of the silicon carbide semiconductor device 20 and the Mo film 32, and the formation of silicide by laser annealing is facilitated. Further, in the images after the laser annealing (for example, FIGS. 9A and 9B), the damage layer 34 is not present and therefore, is thought to be mitigated by the laser annealing silicide formation process.

Next, laser annealing is performed, forming the ohmic electrode 21 containing nickel silicide and molybdenum carbide. The laser annealing uses, as the laser, for example, a third high frequency (355 nm) of a YAG laser, and laser energy is set in a range from 2.0 J/cm$^2$ to 3.0 J/cm$^2$. Further, the laser annealing is performed so that a single area is irradiated with laser light two or three times. For example, when irradiation of the laser light is performed scanning on the silicon carbide semiconductor substrate, a single area may be irradiated by laser two or three times by setting the laser overlap to 33/33, 67/50, 67/67, 67/80. The state up to here is depicted in FIG. 13. Next, for example, a thick film such as a stacked film in which the Ti film 22 and the Ni/Au film 23 are sequentially stacked is formed by, for example, electron beam (EB) vapor deposition. In this manner, the power semiconductor chip 1 is formed.

A method of manufacturing the power semiconductor module in FIG. 1 is similar to a method of manufacturing a power semiconductor module by a conventional technique. In the method of manufacturing the power semiconductor module, first, the power semiconductor chip 1 is mounted on the stacked substrate 12, the power semiconductor chip 1 and the electrode pattern 4 provided on the insulated substrate 2 are electrically connected by the lead frame wiring 6 via the solder 24 (the bonding material 3b). Next, these are bonded to the metal substrate 5, and the stacked assembly including the power semiconductor chip 1, the stacked substrate 12, and the metal substrate 5 is assembled. The resin case 7 is adhered to this stacked assembly by an adhesive such as a silicone-based adhesive.

Next, the metal wire 10 makes connections between the power semiconductor chip 1 and the metal terminal 9, and the resin case 7 is filled with the sealing resin 8 such as a hard resin like an epoxy resin. Thus, the power semiconductor module according to the embodiment depicted in FIG. 1 is completed. In an instance in which the sealing resin 8 is not a hard resin such as an epoxy resin, a cover is attached so that the sealing resin 8 does not leak out.

As described above, according to the silicon carbide semiconductor device and the method of manufacturing a silicon carbide semiconductor device of the embodiment, in the ohmic electrode, the ratio of the arithmetic area of the second regions where the silicide is thin is in a range from 10% to 30%. As a result, the adhesion between the ohmic electrode and the Ti film improves and the resistance of the ohmic electrode and the Ti film may be improved. Further, before the ohmic electrode is formed, the back surface is polished so that the roughness (Ra) of the back surface is in a range from 2 nm to less than 10 nm. As a result, the damage layer is formed at the back surface and the formation of the silicide by laser annealing is facilitated.

In the foregoing, the present invention may be variously modified within a range not departing from the spirit of the invention and in the embodiments described above, for example, dimensions, impurity concentrations, etc. of regions are variously set according to necessary specifications. Further, the embodiment is applicable to silicon carbide semiconductor devices such as a MOSFET, a diode, etc.

According to the invention described above, in the ohmic electrode, the ratio of the arithmetic area of the second regions where the silicide is thin is in a range from 10% to 30%. As a result, adhesion between the ohmic electrode and the Ti film (protective film) improves, and the resistance of the ohmic electrode and the Ti film may be improved. Further, before the ohmic electrode is formed, the back surface is polished so that the roughness (Ra) of the back surface is in a range from 2 nm to less than 10 nm. As a result, the damage layer is formed at the back surface, and the formation of silicide by laser annealing is facilitated.

The silicon carbide semiconductor device and method of manufacturing a silicon carbide semiconductor device according to the present invention achieve an effect in that adhesion between the ohmic electrode and a region formed on the ohmic electrode improves and long-term reliability is achieved.

As described above, the silicon carbide semiconductor device and the method of manufacturing a silicon carbide semiconductor device according to the present invention are useful for power semiconductor devices used in power converting equipment such as inverters, power source devices such as in various types of industrial machines, and automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate;
a semiconductor device provided on the semiconductor substrate; and
an ohmic electrode provided on a back surface of the semiconductor device, and having opposite first and second surfaces, the first surface facing the back surface of the semiconductor device, the ohmic electrode containing a nickel silicide and a molybdenum carbide, or a nickel silicide and a titanium carbide, the ohmic electrode being configured by a first region and a second region, where a silicide of the second region has a thickness that is less than a thickness of a silicide of the first region, a ratio of an arithmetic area of the second region to an arithmetic area of the ohmic electrode being in a range from 10% to 30% in a plan view of the semiconductor device.

2. The silicon carbide semiconductor device according to claim 1, wherein
a roughness (Ra) of the back surface of the semiconductor device is in a range from 0.1 μm to 0.15 μm.

3. The silicon carbide semiconductor device according to claim 1, further comprising
a protective film provided on the second surface of the ohmic electrode, and containing titanium, titanium nitride, or tantalum.

4. A method of manufacturing a silicon carbide semiconductor device according to claim 1, the method comprising:
forming the semiconductor device on an upper surface of the semiconductor substrate;
polishing the back surface of the semiconductor device-to have a roughness (Ra) of the back surface in a range from 2 nm to 10 nm;
sequentially depositing on the back surface of the semiconductor device after polishing, the molybdenum and the nickel, or the titanium and the nickel; and
forming the ohmic electrode through a laser annealing treatment after sequentially depositing the molybdenum and the nickel, or the titanium and the nickel.

5. The method according to claim 4, wherein
the ohmic electrode is formed by irradiating laser light two or three times on a region in which the molybdenum and the nickel or the titanium and the nickel are sequentially deposited.

6. The method according to claim 4, further comprising
forming a protective film containing titanium, titanium nitride, or tantalum, on a first surface of the ohmic electrode, the first surface being opposite to a second surface of the ohmic electrode facing the semiconductor device.

* * * * *